(12) United States Patent
Murakami

(10) Patent No.: US 6,202,551 B1
(45) Date of Patent: Mar. 20, 2001

(54) SCREEN PRINTING APPARATUS

(75) Inventor: Takehiko Murakami, Inagi (JP)

(73) Assignee: Minami Co., Ltd., Tokyo (JP)

( * ) Notice: Subject to any disclaimer, the term of this patent is extended or adjusted under 35 U.S.C. 154(b) by 0 days.

(21) Appl. No.: 09/366,632

(22) Filed: Aug. 4, 1999

(30) Foreign Application Priority Data

Dec. 4, 1998 (JP) ................................................. 10-361843

(51) Int. Cl.$^7$ .................................................. B05C 17/04
(52) U.S. Cl. ........................................... 101/123; 101/126
(58) Field of Search ..................................... 101/114, 115, 101/123, 126, 127.1, 129

(56) References Cited

U.S. PATENT DOCUMENTS

| | | | |
|---|---|---|---|
| 5,361,694 | * 11/1994 | Dubuit | 101/115 |
| 5,873,939 | * 2/1999 | Doyle et al. | 118/213 |
| 6,089,149 | * 7/2000 | Zelko | 101/115 |

FOREIGN PATENT DOCUMENTS

| | | | |
|---|---|---|---|
| 574760 | * 12/1993 | (EP) | 101/115 |
| 2128933 | * 5/1984 | (GB) | 101/115 |

\* cited by examiner

Primary Examiner—Ren Yan
(74) Attorney, Agent, or Firm—Bacon & Thomas, PLLC

(57) ABSTRACT

The present invention provides a screen printing apparatus which is structured so as to simultaneously apply a creamed solder and an adhesive to a sheet of base plate or print a different pattern and further apply a printing agent at a different thickness, at a stage of a printing process, two mask frames arranged along a direction of transferring of a base plate, a position identifying camera for identifying a position of the base plate with respect to the mask being arranged above the mask frames so as to alternately move to an upper portion of each mask frame, a fixed supporting plate arranged above the mask frames so as to override them, two squeegee supporting plates mounted to the fixed supporting plate at an interval and being structured so as to move along the direction of transferring of the base plate, squeegees being mounted to the squeegee supporting plates, a table for mounting the base plate arranged below the mask frames and structured so as to move in the direction of transferring of the base plate and a direction perpendicular to the transferring direction performing a vertical movement and rotating in a horizontal direction.

15 Claims, 2 Drawing Sheets

SCREEN PRINTING APPARATUS

BACKGROUND OF THE INVENTION

1. Field of the Invention

The present invention relates to a screen printing apparatus, and more particularly to a screen printing apparatus which is structured so as to apply a creamed solder and an adhesive to a sheet of base plate on the assembly line, print a different pattern and further apply a printing agent such as a creamed solder, the adhesive and the like at a different thickness, at a stage of a printing process.

2. Description of the Prior Art

A base plate such as a printed board is fed to the next mounting process so as to be mounted with electronic parts thereon after being applied a creamed solder and the like thereto in accordance with a predetermined pattern by a screen printing machine.

Then, after mounting the electronic parts to the base plate, the adhesive is applied to the base plate or in some cases, the creamed solder is again applied to the base plate in accordance with another pattern, however, this operation can not be performed for printing by using a mask since the electronic parts are mounted on a surface thereof.

Accordingly, it has conventionally been unavoidable to perform the operation by using a nozzle. However, much labor is required for performing the operation under a state that a large number of electronic parts are mounted, so that a large time loss is caused. Further, in the case of applying the creamed solder in another pattern, it is necessary to again mount the electronic parts thereafter, so that a double labor is required.

SUMMARY OF THE INVENTION

The present invention is made by taking the points mentioned above into consideration, and an object of the present invention is to provide a screen printing apparatus which is structured so as to simultaneously apply a creamed solder and an adhesive to a sheet of base plate on the assembly line or print a different pattern and further apply the creamed solder and the like at a different thickness, at a stage of a printing process, thereby solving the problems mentioned above.

In accordance with a first aspect of the present invention, there is provided a screen printing apparatus comprising a squeegee apparatus having a plurality of mask frames arranged along a direction of transferring a base plate, a fixed supporting plate arranged above said mask frames so as to override the mask frames, squeegee supporting plates mounted to said fixed supporting plate at an interval corresponding to said mask frames and structured so as to move along the direction of transferring the base plate at a suitable timing, and squeegees mounted to the squeegee supporting plates and vertically moving at a suitable timing.

In accordance with a second aspect of the present invention, there is provided a screen printing apparatus comprising a squeegee apparatus having a plurality of mask frames arranged along a direction of transferring a base plate, a fixed supporting plate arranged above said mask frames so as to override the mask frames, squeegee supporting plates mounted to said fixed supporting plate at an interval corresponding to said mask frames and structured so as to move along the direction of transferring the base plate at a suitable timing, and squeegees mounted to the squeegee supporting plates and vertically moving at a suitable timing, and a table for mounting the base plate, which is structured so as to be arranged below said mask frames at an interval corresponding to said mask frames, move in the direction of transferring the base plate and a direction perpendicular to the transferring direction at a predetermined timing and perform a vertical movement and a rotation in a horizontal direction.

In accordance with a third aspect of the present invention, there is provided a screen printing apparatus comprising a squeegee apparatus having a plurality of mask frames arranged along a direction of transferring a base plate, a position identifying camera for identifying a position of the base plate with respect to the mask, which is arranged above said mask frame and structured so as to move along the direction of transferring the base plate and a direction perpendicular to the transferring direction at a predetermined stroke, a fixed supporting plate arranged above said mask frames so as to override the mask frames, squeegee supporting plates mounted to said fixed supporting plate at an interval corresponding to said mask frames and structured so as to move along the direction of transferring the base plate at a suitable timing, and squeegees mounted to the squeegee supporting plates and vertically moving at a suitable timing, and a table for mounting the base plate, which is structured so as to be arranged below said mask frames at an interval corresponding to said mask frames, move in the direction of transferring the base plate and a direction perpendicular to the transferring direction at a predetermined timing and perform a vertical movement and a rotation in a horizontal direction.

DESCRIPTION OF THE PREFERRED EMBODIMENT

An embodiment in accordance with the present invention will be described below with reference to the accompanying drawings.

Figure 1:
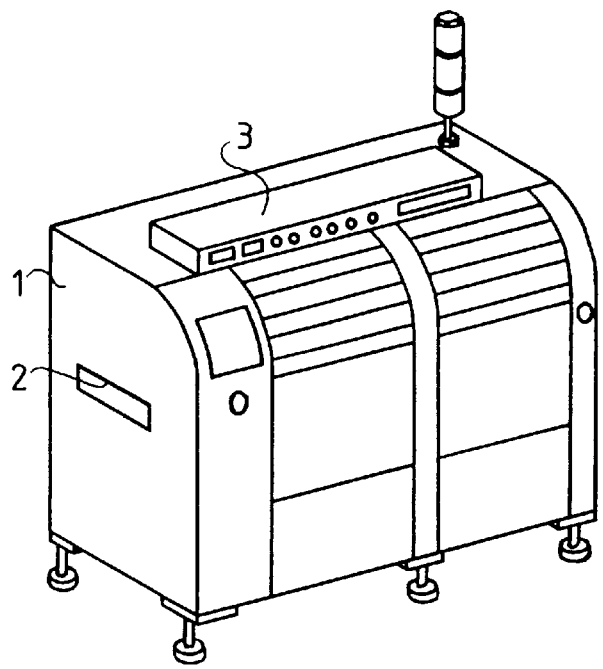
FIG. 1 is a perspective view which shows a whole structure of the present invention.
Figure 3:
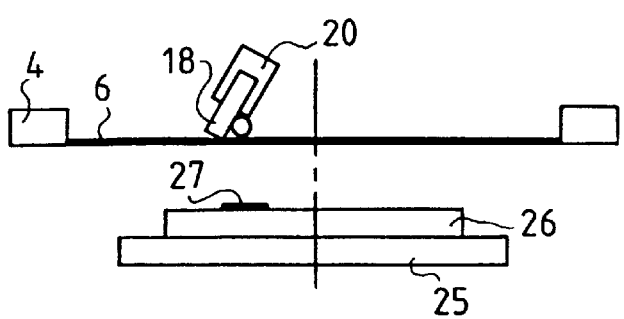
FIG. 3 is a schematic view of an operation of the present invention, which shows a state of applying a creamed solder in a thin manner.
Figure 4:
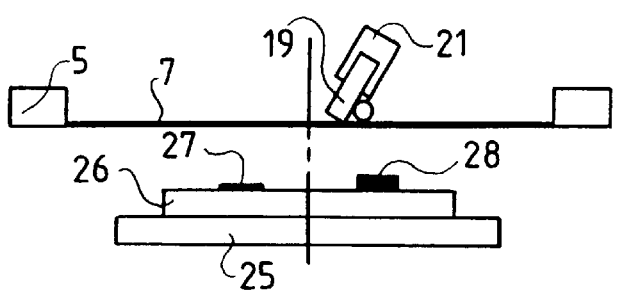
FIG. 4 is a schematic view of an operation of the present invention, which shows a state of applying the creamed solder in a thick manner.
Figure 2:
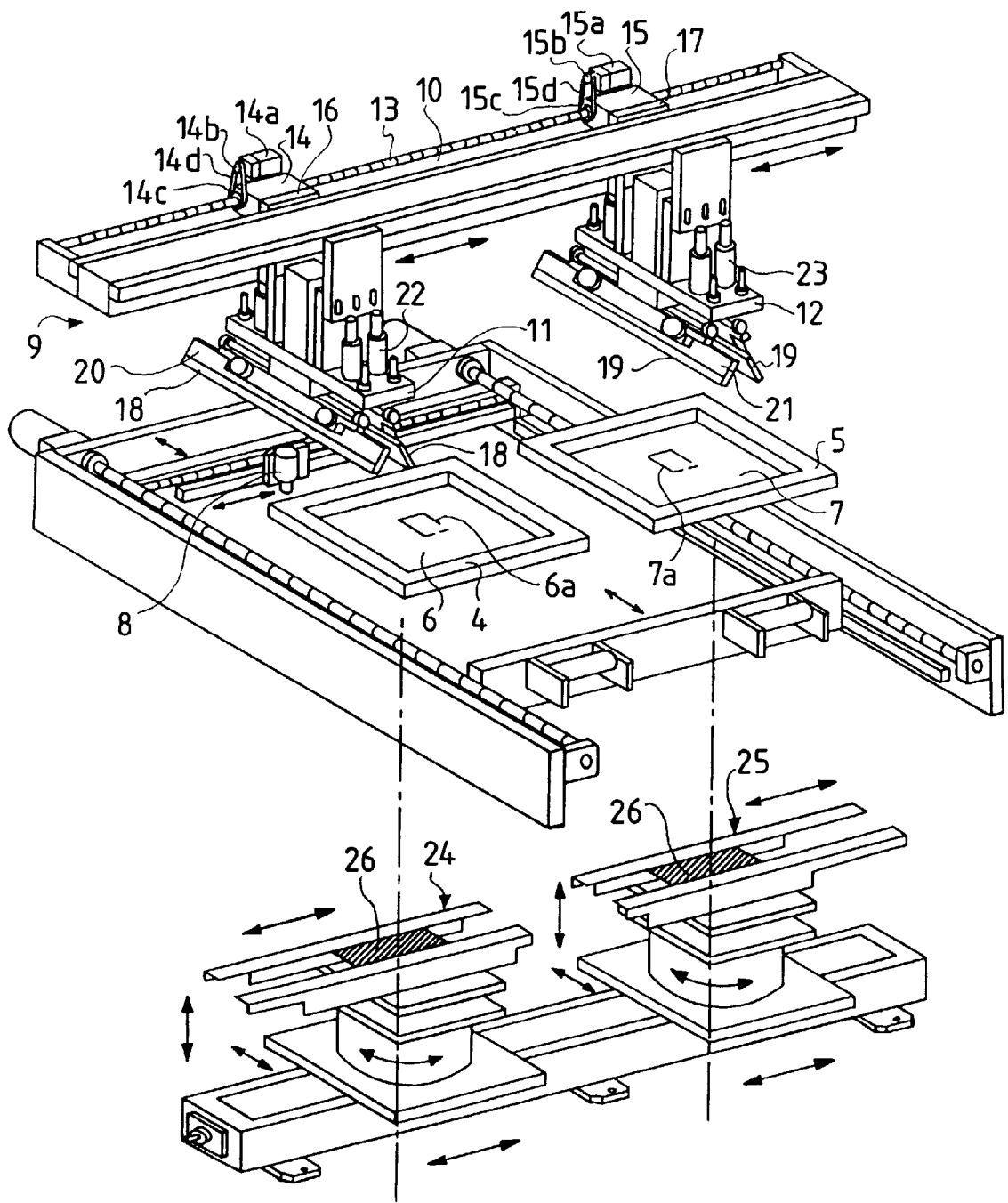
FIG. 2 is an exploded perspective view of the main portion.

FIG. 1 is a perspective view of the whole structure, FIG. 2 is an exploded perspective view of the main portion and FIGS. 3 and 4 are views explaining an operation.

In the drawings, reference numeral 1 denotes a case of a printing apparatus. Reference numeral 2 denotes a base plate inlet port for a printed board and the like, which is provided in the case 1. Further, reference numeral 3 denotes an operation table.

Reference numerals 4 and 5 denote a mask frame for fixing masks 6 and 7, and the mask frames 4 and 5 are arranged side by side along a direction of transferring the base plate. In this case, reference numbers 6*a* and 7*a* denotes patterns respectively formed on the masks 6 and 7. Further, each of the mask frames 4 and 5 is supported by conventionally known means (not shown).

Reference numeral 8 denotes a position identifying camera for identifying a position of the base plate with respect to the mask. Further, the position identifying camera 8 is arranged above two mask frames 4 and 5 and is structured so to move along the direction of transferring of the base plate at a predetermined stroke. In the manner mentioned above, the structure is made such that one camera can alternately identify the positions at two portions.

Reference numeral 9 denote a squeegee apparatus. Reference numeral 10 denotes a fixed supporting plate arranged above the mask frames 4 and 5 in so as to override these two mask frames 4 and 5.

Reference numerals 11 and 12 denotes a squeegee supporting plate mounted to the fixed supporting plate 10 at an interval corresponding to the mask frames 4 and 5 and structured so as to move along the direction of transferring the base plate at a suitable timing. Further, in accordance with the present embodiment, the squeegee supporting plates 11 and 12 are structured so as to be moved by a screw shaft 13 provided in the fixed supporting plate 10 and sliders 14 and 15 moving along the screw shaft 13. In this case, the sliders 14 and 15 are respectively constituted by motors 14*a* and 15*a*, pulleys 14*b* and 15*b* adhered to rotary shafts of the motors 14*a* and 15*a*, pulleys 14*c* and 15*c* connected to cylindrical bodies (not shown) fitted to the screw shaft 13, and belts 14*d* and 15*d* wound between the pulleys. Then, the sliders 14 and 15 are connected to the squeegee supporting plates 11 and 12 via connecting plates 16 and 17.

Reference numerals 18 and 19 denote squeegees mounted to the squeegee supporting plates 11 and 12 and vertically moving at a suitable timing. Further, reference numerals 20 and 21 denote squeegee clips and reference numerals 22 and 23 denote cylinders for vertically moving the squeegees.

Reference numerals 24 and 25 denote tables for mounting the base plate arranged below the mask frames 4 and 5 at an interval corresponding to the mask frames. Further, the tables 24 and 25 are structured so as to move in the direction of transferring the base plate and a direction perpendicular to the transferring direction at a predetermined timing and perform a vertical movement and a rotation in a horizontal direction. Further, in the drawings, reference numeral 26 denotes a base plate and reference numerals 27 and 28 denote a creamed solder.

Next, an operation of the present embodiment will be described below.

The present embodiment corresponds to a case of applying a creamed solder in a different thickness, in which the creamed solder 27 is at first applied to the base plate 26 in a thickness of 70 $\mu$m using the mask 6 and the squeegee 18 as shown in FIG. 3, next the base plate 26 is moved to a position of the mask 7 as shown in FIG. 4 and the creamed solder 28 is applied in a thickness of 180 $\mu$m with using the mask 7 and the squeegee 19. Here, in this case, in order to prevent the creamed solder 27 which has been already applied from attaching to the back surface of the mask, it is desirable to notch the back side portion of the mask 7 corresponding to the position at which the creamed solder 27 is applied in a thickness of the creamed solder 27.

Further, it is possible to print a different pattern on the base plate 26 in the same manner, and further, it is possible to simultaneously apply the creamed solder and the adhesive on a sheet of base plate.

Here, the description will be given of a motion of the table. The table 25 moves upward in such a manner that the base plate 26 comes near the mask 6 and moves downward when an application of the creamed solder 27 is completed. Then, the table moves to a position immediately below the mask 7 and again moves upward. Thereafter, when the creamed solder 28 is applied to the base plate 26, the table moves downward.

Since the present invention is structured in the manner mentioned above, it is possible to simultaneously apply the creamed solder and the adhesive to a sheet of base plate on the assembly line at a stage of the printing process. Accordingly, much labor which has been necessary in the prior art is not required, and it is possible to remove a time loss. Further, since it is possible to simultaneously print the different patterns, it is not necessary to perform a mounting of the electronic parts in accordance with two processes which have been performed in the prior art. Still further, it is possible to apply the creamed solder and the like at a different thickness and simultaneously manufacture a plurality of base plates having the same pattern. Furthermore, since only one position identifying camera and only one fixed supporting plate for the squeegee apparatus are sufficient in view of a mechanism, not much cost is required.

What is claimed is:

1. A screen printing apparatus comprising a squeegee apparatus having a plurality of mask frames arranged along a direction of transferring a base plate, a fixed supporting plate arranged above said mask frames so as to override the mask frames, squeegee supporting plates mounted to said fixed supporting plate at an interval corresponding to said mask frames and structured so as to move along the direction of transferring the base plate at a suitable timing, and squeegees mounted to the squeegee supporting plates and vertically moving at a suitable timing, and a table for mounting the base plate, which is structured so as to be arranged below said mask frames at an interval corresponding to said mask frames, moves in the direction of transferring the base plate and a direction perpendicular to the transferring direction at a predetermined timing and performs a vertical movement and a rotation in a horizontal direction.

2. A screen printing apparatus as claimed in claim 1, wherein a screw shaft and sliders are provided in the fixed supporting plate, said sliders move along said screw shaft, and said squeegee supporting plates are moved by said screw shaft and said sliders.

3. A screen printing apparatus as claimed in claim 2, wherein said sliders are constituted by motors, pulleys adhered to rotary shafts of the motors, pulleys connected to cylindrical bodies fitted to said screw shaft and belts wound between the pulleys.

4. A screen printing apparatus as claimed in claim 3, further comprising connecting plates which connect the sliders to the squeegee supporting plates.

5. A screen printing apparatus as claimed in claim 2, further comprising connecting plates which connect the sliders to the squeegee supporting plates.

6. A screen printing apparatus comprising a squeegee apparatus having a plurality of mask frames arranged along a direction of transferring a base plate, a fixed supporting plate arranged above said mask frames so as to override the mask frames, squeegee supporting plates mounted to said fixed supporting plate at an interval corresponding to said mask frames and structured so as to move along the direction of transferring the base plate at a suitable timing, and squeegees mounted to the squeegee supporting plates and vertically moving at a suitable timing.

7. A screen printing apparatus as claimed in claim 6, wherein a screw shaft and sliders are provided in the fixed supporting plate, said sliders move along said screw shaft, and said squeegee supporting plates are moved by said screw shaft and said sliders.

8. A screen printing apparatus as claimed in claim 7, wherein said sliders are constituted by motors, pulleys adhered to rotary shafts of the motors, pulleys connected to cylindrical bodies fitted to said screw shaft and belts wound between the pulleys.

9. A screen printing apparatus as claimed in claim 8, further comprising connecting plates which connect the sliders to the squeegee supporting plates.

10. A screen printing apparatus as claimed in claim 7, further comprising connecting plates which connect the sliders to the squeegee supporting plates.

11. A screen printing apparatus comprising a squeegee apparatus having a plurality of mask frames arranged along a direction of transferring a base plate, a position identifying camera for identifying a position of the base plate with respect to the mask, which is arranged above said mask frame and structured so as to move along the direction of transferring the base plate and a direction perpendicular to the transferring direction at a predetermined stroke, a fixed supporting plate arranged above said mask frames so as to override the mask frames, squeegee supporting plates mounted to said fixed supporting plate at an interval corresponding to said mask frames and structured so as to move along the direction of transferring the base plate at a suitable timing, and squeegees mounted to the squeegee supporting plates and vertically moving at a suitable timing, and a table for mounting the base plate, which is structured so as to be arranged below said mask frames at an interval corresponding to said mask frames, moves in the direction of transferring the base plate and a direction perpendicular to the transferring direction at a predetermined timing and performs a vertical movement and a rotation in a horizontal direction.

12. A screen printing apparatus as claimed in claim 11, wherein a screw shaft and sliders are provided in the fixed supporting plate, said sliders move along said screw shaft, and said squeegee supporting plates are moved by said screw shaft and said sliders.

13. A screen printing apparatus as claimed in claim 12, wherein said sliders are constituted by motors, pulleys adhered to rotary shafts of the motors, pulleys connected to cylindrical bodies fitted to said screw shaft and belts wound between the pulleys.

14. A screen printing apparatus as claimed in claim 13, further comprising connecting plates which connect the sliders to the squeegee supporting plates.

15. A screen printing apparatus as claimed in claim 12, further comprising connecting plates which connect the sliders to the squeegee supporting plates.

* * * * *